United States Patent [19]

Hayward

[11] 4,262,194
[45] Apr. 14, 1981

[54] HIGH RESOLUTION ELECTRON MICROSCOPE COLD STAGE

[75] Inventor: Steven B. Hayward, Berkeley, Calif.

[73] Assignee: The United States of America as represented by the Department of Health, Education & Welfare, Washington, D.C.

[21] Appl. No.: 104,983

[22] Filed: Dec. 18, 1979

[51] Int. Cl.$^3$ ............... G01N 21/00; G01N 23/00; H01J 37/00

[52] U.S. Cl. ............................... 250/440; 250/443

[58] Field of Search ............... 250/443, 440, 311; 313/11, 46

[56] References Cited

U.S. PATENT DOCUMENTS

| | | | |
|---|---|---|---|
| 2,858,444 | 10/1958 | Leisegang | 250/443 |
| 3,171,955 | 3/1965 | Cardile | 250/443 |
| 3,244,877 | 4/1966 | Herrmann et al. | 250/443 |
| 3,373,277 | 3/1968 | Heide | 250/443 |

FOREIGN PATENT DOCUMENTS 1190593 4/1965 Fed. Rep. of Germany ........... 250/443

Primary Examiner—Bruce C. Anderson
Attorney, Agent, or Firm—Browdy and Neimark

[57] ABSTRACT

A cold stage for an electron microscope, said cold stage being arranged to reduce relative motion between the sample holder and the objective lens. The cold stage consists of an annular stainless steel body on which is coaxially bolted a plastic insulator ring with a plurality of spaced upstanding short vertical posts. A central arbor of gold-plated copper has outwardly projecting radial lugs engaged on and bolted to said posts. Connected to another radial lug projecting from the arbor is a laminated thermally conducting strap member consisting of 40 superposed thin flexible leaves of heat-softened copper, with a 180° blend to absorb vibrations from the associated cold finger, or heat transfer rod, leading from a liquid nitrogen cooling source.

14 Claims, 4 Drawing Figures

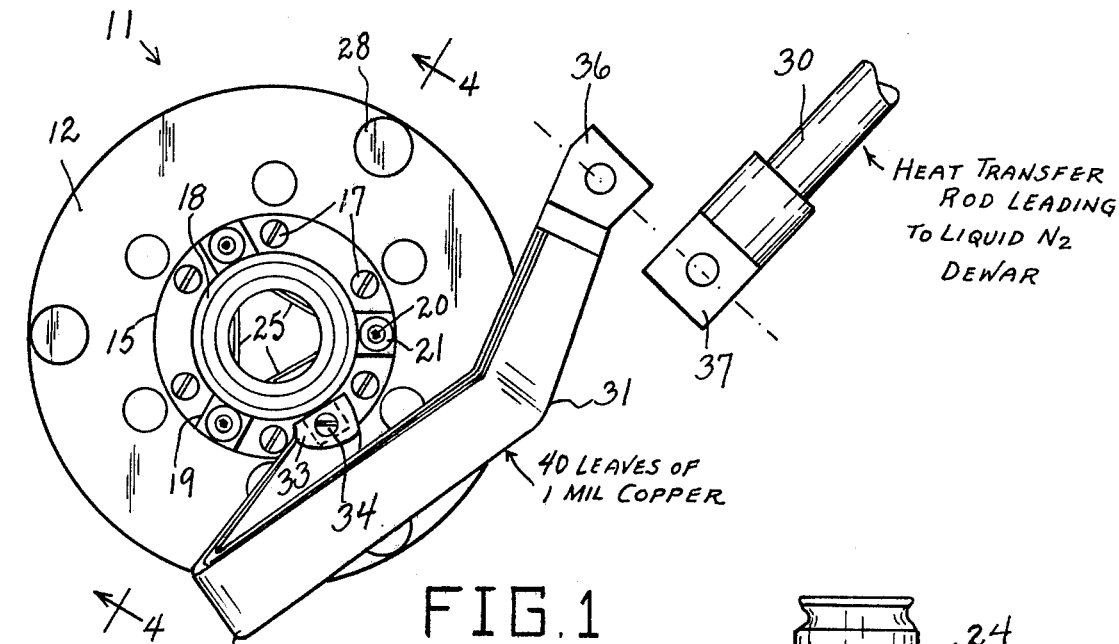
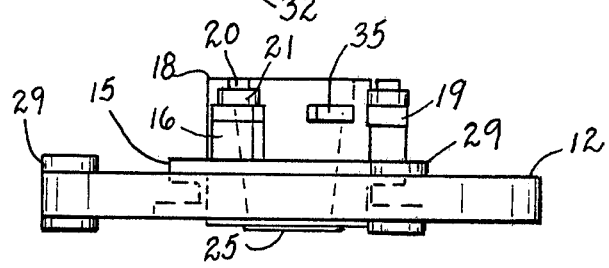
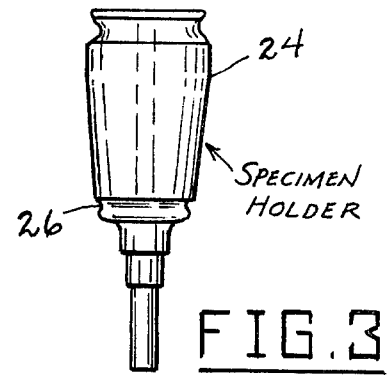
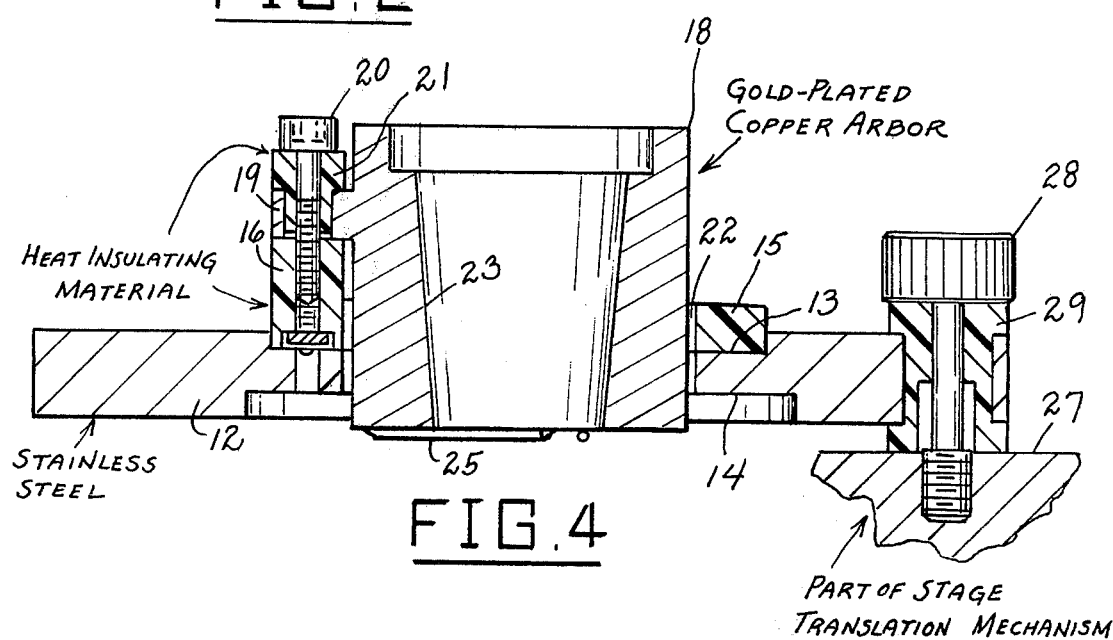

HIGH RESOLUTION ELECTRON MICROSCOPE COLD STAGE

FIELD OF THE INVENTION

This invention relates to electron microscopes, and more particularly to an improved cold stage for an electron microscope, said cold stage being specifically designed to reduce relative motion between the sample holder and the objective lens.

The invention described herein was made in the course of work under a grant or award from the Department of Health, Education and Welfare.

BACKGROUND OF THE INVENTION

In an electron microscope where the sample being studied is maintained at the same temperature as the objective lens, the sample holder is screw-fastened to the lens, so that vibration or other disturbance does not produce any relative motion between the two, and the image remains in focus. However, sometimes it is desirable to image a specimen in an electron microscope while maintaining the specimen at a low temperature. This requires a heat insulator between the sample holder and the body portion of the stage that is screw-fastened to the objective lens. In this case, relative motion between the two is possible, and the image goes in and out of focus, thus reducing the resolution of the microscope.

In the past, imaging low temperature specimens to high resolution was impossible because of the poor mechanical stability of the cold stages used.

In a typical cold stage of the prior art, the cold stage consists of a brass disc, or stage body, which is screw-fastened onto the stage support at three points. The stage body has a hole in the center which contains an insulating plastic ring into which is bolted the stage "arbor". This arbor is a gold-plated copper annulus with its center hole cut at a taper to accommodate the specimen cartridge. The arbor is cooled by a length of copper braid, which is soldered to the arbor and bolted to a copper cold finger that extends into the column from a liquid nitrogen dewar employed as a cooling source. This stage requires approximately 1½ hours to cool down and produces a steady-state temperature of about −120° C. at the top of the specimen cartridge. Its chief stability problem appears to be the generation of a drumhead-type motion of the plastic insulating ring which prevents the arbor from being ridigly coupled to the stage body. Vibrational input causing lack of vertical synchrony between the arbor and the objective lens polepiece apparently is derived from one or more of three sources: (1) ambient floor vibrations transmitted to the stage body, (2) vibrations of the cold finger due to amplification of ambient floor vibrations by the long lever arm of the dewar to the column, and (3) vibrations of the cold finger due to boiling of the liquid nitrogen.

In general, the results obtainable with the above-described prior art cold stage are not satisfactory for imaging specimens at low temperature, for example, for imaging purple membranes, requiring a liquid nitrogen-cooled stage stable to 3.5 Angstroms.

A preliminary search of the patented prior art revealed the following prior U.S. Pat. Nos. of interest:
Leisegang 2,858,444
Herrmann et al, 3,151,241
Matthews 3,230,773
Kolenko, 3,297,491

SUMMARY OF THE INVENTION

A typical improved cold stage according to the present invention may comprise a stainless steel body to which is bolted a plastic insulating ring with three integral upstanding vertical posts, to which is bolted a central arbor with a tapered bore, said arbor comprising gold-plated copper. Stainless steel is preferably employed for the stage body, to reduce heat flow and to add structural rigidity. The plastic insulator may comprise a fiberglass-embedded epoxy, such as that called "Nema-G", which has a very low coefficient of torsional strain and a low degree of compressibility. The geometry is such that in order to vibrate vertically with the stage body, the arbor has to compress the upstanding posts of the insulating ring. This requires a large-masgnitude input force.

Further stability is achieved by replacing the copper braid formerly employed with a laminar thermal conducting strap made of a large number of superposed leaves of heat-softened copper foil, for example, 40 superposed leaves. This thermal conducting lead is formed with a 180° reverse bend to aid in abosrbing vibrations transmitted from the associated cold finger. Finally, the associated heat absorbing agent may comprise a nitrogen dewar which is itself rigidly attached at its base to the associated supporting column to prevent it from oscillating vertically.

Accordingly, a main object of the present invention is to provide an improved electron microscope cold stage which avoids and overcomes the deficiencies and disadvantages of cold stage structures previously employed with electron microscopes.

A further object of the invention is to provide an improved electron microscope cold stage which can successfully image low temperature specimens with high resolution and which includes a stainless steel body to reduce heat flow and add structural rigidity.

A still further object of the invention is to provide an improved high-resolution electron microscope cold stage which employs a plastic insulator between the stage body and specimen cartridge-receiving arbor, the insulator having a geometry which resists relative motion between the arbor and the stage body and minimizes vibration between the arbor and the objective lens of the electron microscope.

A still further object of the invention is to provide an improved electron microscope cold stage which employs a laminar thermal conducting lead made of many superposed leaves of soft metal foil, with a reversely bent configuration which absorbs vibrations and which prevents the transmission of such vibrations from the associated cold finger to the remaining parts of the cold stage, thereby enabling high resolution imaging of samples at low temperatures to be successfully achieved.

A still further object of the invention is to provide an improved high-resolution electron microscope cold stage which substantially prevents ambient floor vibrations from being transmitted to the stage body, which prevents such transmission of vibrations from the cold finger due to amplification of ambient floor vibrations by the long lever arm of the associated liquid nitrogen dewar, and which prevents such transmission of vibrations of the cold finger caused by boiling of the liquid nitrogen.

BRIEF DESCRIPTION OF THE DRAWINGS

Further objects and advantages of the invention will become apparent from the following description and claims, and from the accompanying drawings, wherein:

FIG. 1 is a top plan view of an improved electron microscope cold stage assembly constructed in accordance with the present invention.

FIG. 2 is an elevational view of the cold stage assembly of FIG. 1, with the laminar thermal conductive strap removed.

FIG. 3 is an elevational view of a typical specimen cartridge which is adapted to be used with the cold stage of FIGS. 1 and 2.

FIG. 4 is an enlarged vertical cross-sectional view taken substantially on the line 4—4 of FIG. 1.

DESCRIPTION OF A PREFERRED EMBODIMENT

As will be readily understood from the above discussion, in an electron microscope, vibration or any other disturbance which causes relative motion between the sample under study and the objective lens causes the image to go in and out of focus, thus reducing the resolution of the microscope. The following is a detailed description of a preferred version of an improved cold stage according to the present invention specifically constructed and arranged to reduce the relative motion between the sample and the objective lens.

Referring to the drawings, 11 generally designates a cold stage assembly according to the invention. Said assembly 11 comprises a substantially flat annular stage body 12 made of stainless steel, or equivalent metallic material with relatively low heat flow characteristics, having high structural rigidity. The stage body 12 is formed with an axial top annular recess 13 and with a somewhat larger axial bottom annular recess 14.

Designated at 15 is a generally annular plastic insulator integrally formed with three equally spaced short upstanding vertical posts 16. The plastic insulator 15 is made from a fiberglass-embedded epoxy called "Nema-G", or equivalent insulating material which has a very low coefficient of torsional strain and a high resistance to compression. The plastic ring member 15 is snugly received in the annular seat 13 and is rigidly bolted therein by a plurality of fastening bolts or screws 17. The inside diameter of the plastic ring member 15 is the same as the inside diameter of the annular stage body 12 and registers therewith.

Designated at 18 is an annular arbor of gold-plated copper with an outside diameter somewhat smaller then the inside diameters of the members 12 and 15. The arbor 18 has three equally spaced outwardly projecting integral radial lugs 19 which are bolted onto the upstanding post members 16 by respective vertical fastening bolts or screws 20, with heat-insulating plastic combination washer-sleeves 21 provided beneath the heads of the bolts and projecting into the lugs, as shown in FIG. 4. The washer-sleeves 21 may be of the same plastic material as the annular ring member 15. As shown in FIG. 4, the arbor 18 extends through the plastic ring member 18 and the annular body 12, with a small annular clearance space 22 being defined around the arbor.

The arbor 18 has a downwardly tapering main bore 23 forming a receiving seat for a conventional specimen holder 24. Secured at their ends to the bottom of the arbor 18, marginally crossing the bottom of said main bore, are a plurality of resilient locking spring rods 25 lockingly engageable in an annular locking groove 26 provided at the bottom end of the tapering main body portion of the specimen holder 24 to yieldably retain the holder 24 in the tapered bore 23 of the arbor when the specimen holder has been seated in said bore.

The stage body 12 is secured to a conventional fixed underlying support structure, shown at 27 in FIG. 4, by three equally spaced fastening bolts 28 extending through apertures provided in the stage body 12 near its periphery and being thermally insulated therefrom by plastic grommet-like support buttons 29 provided in said apertures. Said buttons 29 are preferably made of the same plastic insulating material as ring member 15 and washers 21, namely, "Nema-G", or equivalent material.

As above mentioned, the copper braid formerly employed in the prior art as a cooling connection to the heat transfer rod, shown at 30, leading to the liquid nitrogen dewar used as the cooling source, is replaced in the improved assembly of the present invention by a laminar thermal conducting strap 31 formed of 40 superposed leaves of thin heat-softened copper foil, such as foil 1 mil in thickness. The laminar strap 31 is formed with a 180° reverse bend 32 between its arbor terminal and its heat transfer rod terminal, as shown in FIG. 1, to help in absorbing vibrations coming from the cold finger 30. The arbor terminal may comprise a rigid body of solder 33 in which the ends of the foil leaves are embedded, apertured to receive a fastening screw 34 which clampingly secures the terminal 33 to an outwardly projecting radial lug 35 integrally formed on the upper portion of the arbor, as shown in FIG. 2. The outer ends of the foil leaves may be soldered to an apertured outer terminal 36 adapted to be rigidly bolted to the conventional apertured end terminal 37 of the cold finger 30.

In actual use it was found that the microscope resolution was improved by about a factor of two, as over that available with the prior art cold stage described above. Images of a thin carbon film were recorded at 200,000× magnification, with the stage at low temperature. The optical pattern extended to 3.7 Å, which is the resolution routinely achieved with the stage, even down to 80,000× magnification. Occasionally, images extending to as high as 3.3 Å resolution were recorded.

Although with the cold stage of the present invention the time required to reach thermal equilibrium is somewhat increased and the equilibrium temperature of the cartridge 24 is somewhat higher (−80° C. as compared with −120° C.), due to the slightly greater heat conductivity of the stronger Nema-G plastic insulator 15 and the slightly lowered heat conductivity of the relatively longer thermal conducting strap 31, the reduced cooling capacity appears to have no effect on attempts to image samples such as purple membrane, since critical dose experiments showed no difference in radiation sensitivity between −120° C. and −80° C.

While a specific embodiment of an improved electron microscope cold stage has been disclosed in the foregoing description, it will be understood that various modifications within the scope of the invention may occur to those skilled in the art. Therefore it is intended that adaptations and modifications should and are intended to be comprehended within the meaning and range of equivalents of the disclosed embodiment.

What is claimed is:

1. A cold stage for an electron microscope of the type having a lens support structure and being provided with a heat transfer rod element leading to a cooling source, said cold stage comprising a generally flat annular metallic body, means to secure said body on the lens support structure, a plastic insulator ring member coaxially mounted on said metallic body and having a plurality of spaced upstanding posts, a metallic arbor formed to receive a specimen holder, said arbor being disposed centrally in said annular metallic body and having a plurality of outwardly projecting lugs engaged on and secured to said posts, and a relatively flexible thermally conducting strap member connecting said central arbor to said heat transfer rod element.

2. The cold stage of claim 1, and wherein said annular metallic body is formed with an annular top recess receiving said plastic insulator ring member.

3. The cold stage of claim 1, and wherein said upstanding posts are integral with said ring member.

4. The cold stage of claim 1, and wherein said annular metallic body is formed of stainless steel.

5. The cold stage of claim 1, and wherein said plastic insulator ring member comprises Nema-G fiberglass-embedded epoxy material.

6. The cold stage of claim 1, and wherein said thermally conducting strap member is formed at its intermediate portion with a substantially 180° reverse bend for absorbing vibrations from the heat transfer rod element.

7. The cold stage of claim 1, and wherein said thermally conducting strap member comprises a plurality of superposed thin leaves of metal foil material.

8. The cold stage of claim 1, and wherein said outwardly projecting lugs of the arbor are secured on the top ends of the upstanding posts by respective vertical headed bolts extending through the lugs and engaged in the posts by nuts fitted into recesses in the bottom of said posts.

9. The cold stage of claim 8, and heat insulating plastic combination washer-sleeves on the bolts beneath the heads thereof.

10. The cold stage of claim 1, and wherein said arbor is provided with an additional outwardly projecting lug, and wherein said strap member has one end terminal engaged on and clampingly secured to said additional lug.

11. The cold stage of claim 1, and wherein said strap member comprises approximately 40 superposed elongated thin leaves of heat-softened copper, each being approximately 1 mil in thickness, forming a laminar structure, and is provided with relatively rigid metallic end terminals, the ends of the leaves being bonded to said end terminals.

12. The cold stage of claim 11, and wherein said strap member is formed with an approximately 180° reverse bend at its intermediate portion to absorb vibrations from said heat transfer rod element.

13. The cold stage of claim 1, and wherein said means to secure said body on the lens support structure includes heat insulating means.

14. The cold stage of claim 13, and wherein said annular metallic body is provided with fastening openings and said heat insulating means comprises plastic heat insulating grommets in said fastening openings and respective fastening bolts engaged through said grommets.

* * * * *